United States Patent
Baril (10) Patent No.: US 8,758,704 B2
(45) Date of Patent: Jun. 24, 2014

(54) MICROFLUIDIC DIAGNOSTIC DEVICE

(75) Inventor: Daniel J. Baril, Hampton, NH (US)

(73) Assignee: Baril Corporation, Haverhill, MA (US)

( * ) Notice: Subject to any disclaimer, the term of this patent is extended or adjusted under 35 U.S.C. 154(b) by 321 days.

(21) Appl. No.: 12/846,692

(22) Filed: Jul. 29, 2010

(65) Prior Publication Data

US 2011/0038767 A1 Feb. 17, 2011

Related U.S. Application Data

(60) Provisional application No. 61/233,037, filed on Aug. 11, 2009.

(51) Int. Cl.
*B01L 3/00* (2006.01)
*B32B 38/14* (2006.01)
*B32B 38/18* (2006.01)

(52) U.S. Cl.
USPC ............ 422/503; 156/60; 156/277; 428/200; 428/201

(58) Field of Classification Search
USPC ........ 422/500–507; 156/275.5, 277; 600/345, 600/347, 300, 309, 310, 316
See application file for complete search history.

(56) References Cited

U.S. PATENT DOCUMENTS

| | | | | |
|---|---|---|---|---|
| 4,761,381 A | * | 8/1988 | Blatt et al. | 436/165 |
| 6,074,725 A | | 6/2000 | Kennedy | |
| 6,082,185 A | * | 7/2000 | Saaski | 73/64.56 |
| 2002/0061595 A1 | * | 5/2002 | Yabuki et al. | 436/39 |
| 2002/0192701 A1 | * | 12/2002 | Adey | 435/6 |
| 2003/0199744 A1 | * | 10/2003 | Buse et al. | 600/347 |
| 2004/0067166 A1 | * | 4/2004 | Karinka et al. | 422/82.03 |
| 2004/0109793 A1 | | 6/2004 | McNeely et al. | |
| 2005/0009101 A1 | * | 1/2005 | Blackburn | 435/7.1 |
| 2005/0272142 A1 | * | 12/2005 | Horita | 435/287.1 |
| 2006/0141469 A1 | * | 6/2006 | Rossier et al. | 435/6 |
| 2006/0169599 A1 | * | 8/2006 | Feldman et al. | 205/792 |
| 2007/0003444 A1 | * | 1/2007 | Howell et al. | 422/100 |
| 2007/0009391 A1 | * | 1/2007 | Bedingham et al. | 422/100 |
| 2007/0217957 A1 | | 9/2007 | Flachsbart et al. | |

OTHER PUBLICATIONS

Kiwoprint TC, Kiwo, Inc., 2001.*
International Search Report, PCT/US2010/043772, Baril Corporation et al., Int. Filing Date: Jul. 29, 2010, 10 pages.

* cited by examiner

*Primary Examiner* — Jill Warden
*Assistant Examiner* — Timothy G Kingan
(74) *Attorney, Agent, or Firm* — Finch & Maloney PLLC (57) ABSTRACT

A method of making a microfluidic diagnostic device for use in the assaying of biological fluids, whereby a layer of adhesive in a channel pattern is printed onto a surface of a base sheet and a cover sheet is adhered to the base sheet with the adhesive. The layer of adhesive defines at least one channel, wherein the channel passes through the thickness of the adhesive layer.

10 Claims, 5 Drawing Sheets

MICROFLUIDIC DIAGNOSTIC DEVICE

RELATED APPLICATIONS

This application claims benefit of U.S. Provisional Patent Application Ser. No. 61/233,037, filed Aug. 11, 2009 and titled MICROFLUIDIC DIAGNOSTIC DEVICE. This provisional application is hereby incorporated by reference herein.

FIELD

The present disclosure relates to a diagnostic device for use in the assaying of biological fluids, and, more particularly, to a multilayered lateral flow microfluidic diagnostic device having channels formed from a printed adhesive.

BACKGROUND

In medical diagnostic test devices, biological fluids such as whole blood, plasma, serum, nasal secretions, sputum, saliva, urine, sweat, transdermal exudates, cerebrospinal fluids and the like may be analyzed for specific components and properties that are clinically important for monitoring and diagnosis. As is well understood in the medical community, lateral flow test strips can be used in medical and other applications to provide convenient and simple analysis of many important biological fluid samples. Microfluidic devices can also be used in the assaying of biological samples.

SUMMARY

In one aspect, a method of making a microfluidic diagnostic device is provided, the method comprising printing a layer of adhesive in a channel pattern onto a surface of a base sheet, wherein the pattern defines at least one channel passing through the thickness of the adhesive, and adhering a cover sheet to the base sheet with the adhesive to enclose the at least one channel when the cover sheet is adhered to the base sheet and wherein at least a portion of the channel has a mean width less than 1.0 mm.

In another aspect, a method of making a microfluidic diagnostic device is provided, the method comprising printing a layer of adhesive in a channel pattern onto a transfer sheet having a non-stick surface, wherein the pattern defines at least one channel passing through the thickness of the adhesive, transferring the pattern from the transfer sheet onto a surface of a base sheet, adhering a cover sheet to the base sheet with the adhesive to enclose the at least one channel when the cover sheet is adhered to the base sheet, and wherein at least a portion of the at least one channel has a mean width less than 1.0 mm.

In another aspect, a method of making a microfluidic diagnostic device is provided, the method comprising printing a layer of adhesive in a channel pattern onto a surface of a base sheet, wherein the pattern defines at least one channel passing through the thickness of the adhesive, adhering a cover sheet to the base sheet with the adhesive to enclose the at least one channel when the cover sheet is adhered to the base sheet, and wherein either the base sheet or the cover sheet or both comprise a non-hydrophilic surface in contact with the at least one channel.

In another aspect, a microfluidic diagnostic device adapted for use in the assaying of biological fluids is provided, the device comprising a base sheet, an adhesive disposed on a surface of the base sheet, wherein the adhesive defines at least one fluid transport channel, the channel having a mean width less than 0.6 mm, a cover sheet adhered to the base sheet by means of the adhesive, wherein the cover sheet encloses the at least one channel when the cover sheet is adhered to the base sheet, and wherein either the base sheet or the cover sheet or both comprise a hydrophilic surface in contact with the adhesive.

In another aspect, a microfluidic diagnostic device adapted for use in the assaying of biological fluids is provided, the device comprising a base sheet, an adhesive disposed on a surface of the base sheet, wherein the adhesive defines a plurality of fluid transport channels, a cover sheet adhered to the base sheet by means of the adhesive, wherein the cover sheet encloses the plurality of channels when the cover sheet is adhered to the base sheet; and wherein adjacent channels are separated by adhesive and by non-channel space that is void of adhesive.

The devices may include multiple layers of adhesive and the adhesive may be printed on a non-adhesive that has been applied to the base in the same pattern. The devices may be used with or without pumps or vacuum sources and may rely on capillary flow for moving liquid samples.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrated embodiments, many alternatives, modifications, and variations thereof will be apparent to those skilled in the art.

DETAILED DESCRIPTION

The subject matter of the present disclosure may involve, in some cases, interrelated products, alternative solutions to a particular problem, and/or a plurality of different uses of a single system or article.

The present disclosure relates to a microfluidic diagnostic device having channels formed from printed adhesive, the device being adapted for use in the assaying of biological fluids. The term "microfluidic" refers to the behavior, precise control and manipulation of fluids that are geometrically constrained to a small, typically sub-millimeter, scale. The present disclosure is also concerned with methods of making and using such a microfluidic diagnostic device.

The term "adhesive" is used herein as it is known to those of skill in the art and refers to a material for joining two substrates together. The adhesive typically makes a permanent bond but can be pulled apart in some cases when a force is applied. Adhesives are typically applied as a liquid and then altered, such as by catalytic cross-linking or solvent evaporation, to thicken or solidify the adhesive so that the two joined substrates are rendered immobile with respect to each other.

The terms "printed" and "printing" refer to several printing techniques in which an adhesive may be printed onto a base sheet or cover sheet of a microfluidic diagnostic device in a specific pattern that provides for areas of adhesive as well as defined areas void of adhesive. A pattern that includes channels (void areas) can be printed in a single step rather than multiple steps as with die cutting. In many embodiments when an adhesive pattern is printed there is no waste as all of the adhesive material that is deposited on the substrate stays on the substrate or is transferred to another substrate in its entirety. In contrast, die cutting requires the removal of a portion of the adhesive. Printing techniques may include screen printing, pad printing, spray printing, ink jet printing, transfer printing, flexographic printing, and offset printing. For example, screen printing can be used to apply a precisely controlled layer of patterned adhesive to a specific area on a surface. In this method, liquid adhesive can be forced through a pattern on a screen by a squeegee to form an adhesive pattern on the surface. Some of the advantages of screen printing are the precise control of the adhesive layer and the ability to deposit adhesive in specific and precise patterns.

It should be appreciated that while the below is an example directed to a microfluidic diagnostic device adapted for blood testing, other biological fluids can be tested and other assays can be performed by the device disclosed herein. Appropriate blood tests may include, for example, blood sugar content, red blood cell count, white blood cell count, clotting ability, liver function and drug/alcohol testing.

Lateral flow test strips and fluidic devices require a certain amount of biologic fluid sample in order to adequately function and establish an accurate reading. Typically, a fluidic device comprises a base platform within which are formed a number of capillaries or channels which serve to transport the sample from a receiving portion of the device to a collection portion. In order to ensure that proper testing occurs, microfluidic devices require a specific amount of fluid sample to fill the channels. These channels can be formed from a layer of adhesive sheet, in which a channel pattern has been formed, usually by means of die-cutting, or other similar techniques. This method of forming channels has been found to be limiting in regards to channel size, particularly limiting the possibility of creating smaller channel width. Die cutting an adhesive necessarily involves contact between the die surface and the adhesive, resulting in undesirable carryover of adhesive to the cutting edge of the die. Diagnostic devices may benefit from smaller channels that may require less fluid and provide faster results than traditionally sized systems.

Medical diagnostic devices, such as lateral flow test strips and fluidic devices, are used in various settings including hospitals, clinics, alternative care sites and in the home. Fluidic devices may be convenient and reliable in the assaying of biological samples. These devices have been developed by various manufacturers to enable clinical professionals and non-professionals to make accurate decisions for the diagnosis and management of medical conditions. Certain medical conditions and diseases require the continual testing of a patient's blood. Persons suffering from diabetes, for example, typically use a blood lance to pierce the skin (typically of a finger), in order to draw blood to test it for sugar levels using a lateral flow test strip.

Although tests have been developed that employ a less invasive means of obtaining blood, such as a finger puncture, the need still exists for a more rapid, less invasive, and more convenient blood test which encourages more frequent testing to assist health care professionals and patients in determining and adjusting the proper treatment and dosage of medication.

Commonly, fluidic diagnostic devices comprise a base platform within which are formed a number of channels which serve to transport the sample from a receiving portion of the device to a collection portion. Typically, the specimen fluid is deposited at an inlet of a suitable diagnostic device and the sample fluid is drawn into the device by, for example, pressure, vacuum or by capillary flow action. The device may include a detector that may be, for example, optical, electrical or chemical. The detector may be integral to the fluidic device (e.g., a card) or may be in a separate reader which operates in cooperation with the fluidic device. One or more test channels may be included on a single card.

Figure 1:
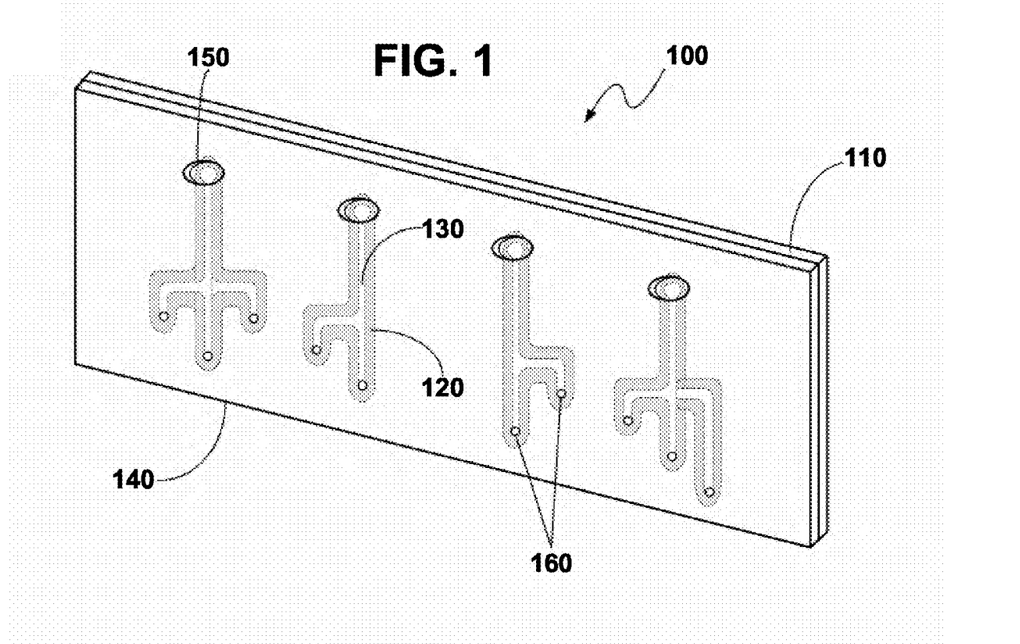
FIG. 1 provides a perspective view of a microfluidic diagnostic device according to one embodiment.

FIG. 1 provides a perspective view of a microfluidic diagnostic device 100 consistent with one embodiment of the present disclosure. Generally, microfluidic device 100 may include a base sheet 110, a printed layer of adhesive 120, the printed adhesive defining at least one fluid transport channel 130, and a cover sheet 140 attached to the base sheet 110 by means of the adhesive layer 120. Cover sheet 140 may include at least one fluid sample inlet portal 150, wherein the portal 150 may be configured to be in fluid communication with at least one channel 130 and base sheet 110. The portal 150 may be adapted to allow a fluid sample to flow into the channel 130. Cover sheet 140 may also include at least one vent aperture 160, wherein the aperture may be configured to be in fluid communication with at least one channel 130 and base sheet 110 and may be adapted to aid in fluid sample flow through the channel 130.

Patterns of adhesive may be printed on top of other substances that have already been applied to the base sheet. For example, a non-adhesive material may first be printed on the base sheet in the same pattern as the adhesive that is printed on top of it. Multiple layers of non-adhesive may be applied prior to application of the adhesive layer. In this manner, the channel layer may be built up to provide a deeper channel without increasing the amount of adhesive required. In some embodiments, one, two, three or more layers of non-adhesive may be applied underneath a printed adhesive layer. In other embodiments this layer can be built up by printing multiple layers of adhesive on top of each other. For example, two, three, four or more layers of adhesive may be printed on top of each other and may be printed in the same pattern.

Figure 2:
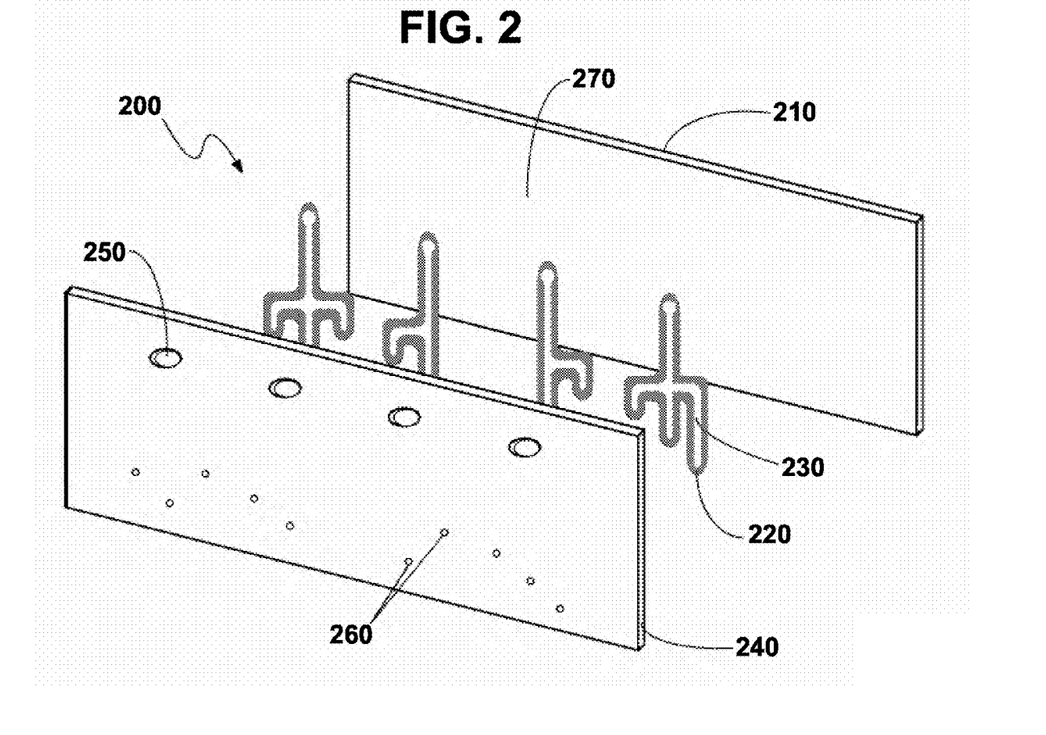
FIG. 2 provides an exploded view of the microfluidic diagnostic device of FIG. 1, according to one embodiment.

FIG. 2 provides an exploded view of microfluidic diagnostic 200 consistent with one embodiment of the present disclosure. This embodiment is similar to the embodiment of FIG. 1, and like components have been assigned like reference numerals. In this embodiment, a microfluidic device 200 may include a base sheet 210, a printed layer of adhesive 220, the printed adhesive defining at least one fluid transport channel 230, and a cover sheet 240 attached to the base sheet 210 by means of adhesive layer 220. Base sheet 210 may have a hydrophilic surface 270. A surface is considered to be "hydrophilic" if it is capable of promoting capillary flow of an aqueous fluid through a channel defined at least in part by the surface. A hydrophilic surface typically exhibits higher surface energy than non-hydrophilic surfaces and hydrophilic surfaces used with the devices described herein may have contact angles with water of less than 90 degrees. In other embodiments, cover sheet 240 may have a hydrophilic surface while base sheet 210 lacks a hydrophilic surface or both base sheet 210 and cover sheet 240 may have hydrophilic surfaces. Cover sheet 240 may include at least one fluid sample inlet portal 250, wherein the portal 250 may be configured to be in fluid communication with at least one channel 230 and base sheet 210. The portal 250 may be adapted to allow a fluid sample to flow into at least one channel 230. Cover sheet 240 may also include at least one vent aperture 260 wherein the aperture may be configured to be in fluid communication with at least one channel 230 and base sheet 210 and may be adapted to aid in fluid sample flow through the channel 230.

Figure 3:
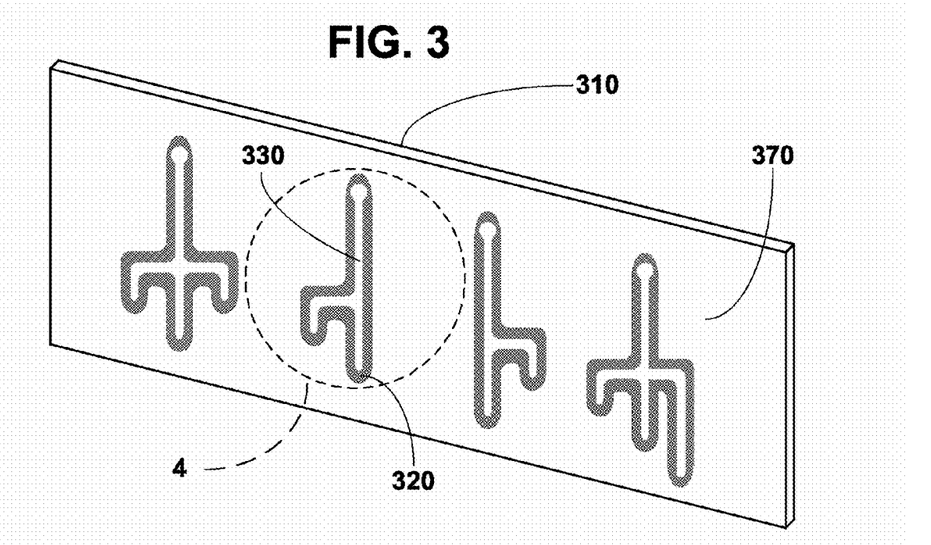
FIG. 3 provides a perspective view of a portion of an embodiment of a microfluidic diagnostic device.

FIG. 3 provides a perspective view of a portion of an embodiment of a microfluidic diagnostic device. This embodiment is similar to the embodiment of FIG. 1, and like components have been assigned like reference numerals. As shown in FIG. 3, base sheet 310 may have a hydrophilic surface 370. Base sheet 310 may also include a printed layer of adhesive 320, the printed adhesive defining at least one fluid transport channel 330.

Figure 4:
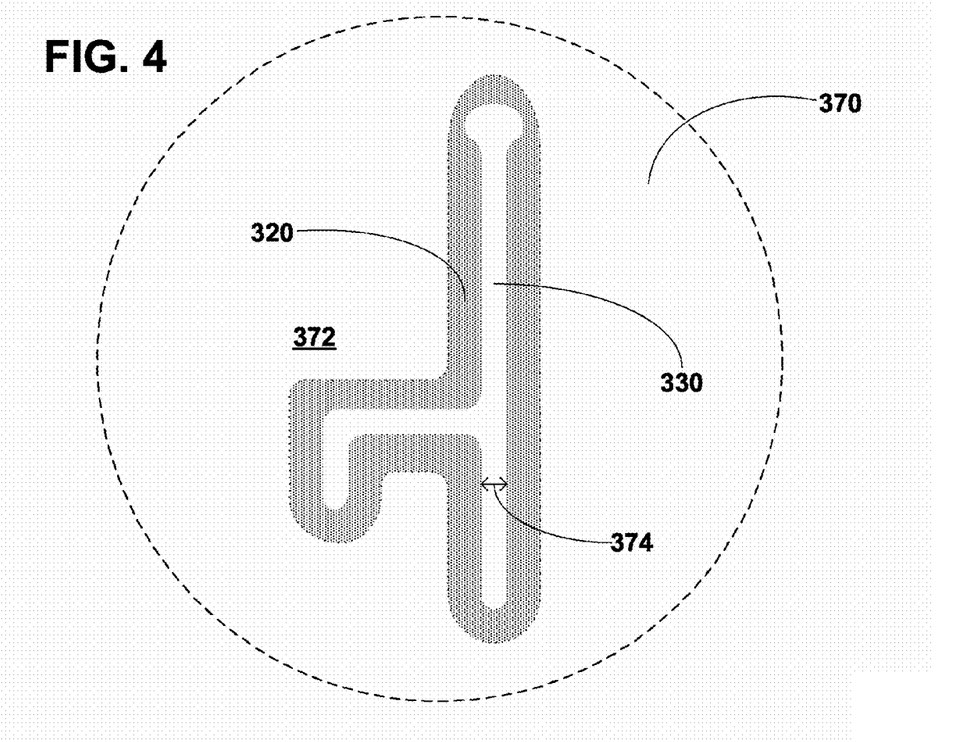
FIG. 4 provides an enlarged view of the embodiment of FIG. 3.

FIG. 4 depicts an enlarged view of a portion of the embodiment of FIG. 3. As can most clearly be seen in FIG. 4, a printed layer of adhesive 320 on a hydrophilic surface 370, the printed adhesive defining at least one fluid transport channel 330. In one embodiment, the adhesive layer 320 may have a thickness (not shown) of, for example, 0.05 to 0.25 mm, 0.10 to 0.20 mm, or about 0.18 mm. Channel 330 may have a mean width 374 of less than, for example, 2.0 mm, 1.5 mm, 1.0 mm, 0.5 mm, 0.25 mm, or 0.1 mm. In some embodiments, the adhesive layer 320 surface thickness and channel 380 mean width 374 may vary within a single device. For instance, a channel may have a greater width at its proximal end than at its distal end. Channel 330, which is defined by the printed adhesive layer 320, may be separated from other printed channels by an area 372 that is void of adhesive. This can result in the use of less adhesive when compared to traditional techniques. In other embodiments, the printed adhesive defines a plurality of channels, wherein adjacent channels are separated by adhesive and by non-channel space 372 that is void of adhesive. It may be appreciated that channel width 374 may vary throughout the entire length of at least one channel 330. It may also be appreciated that at least one channel may vary in shape. For example, channel shapes may include, but are not limited to, straight, torturous, serpentine, branched, etc.

Figure 5A:
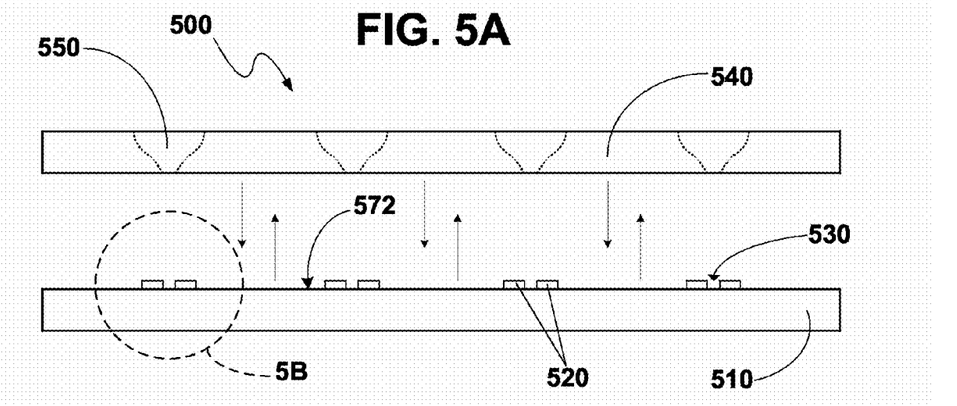
FIGS. 5A and 5C provide a side view of the microfluidic diagnostic device of FIG. 1, according to another embodiment.
Figure 5B:
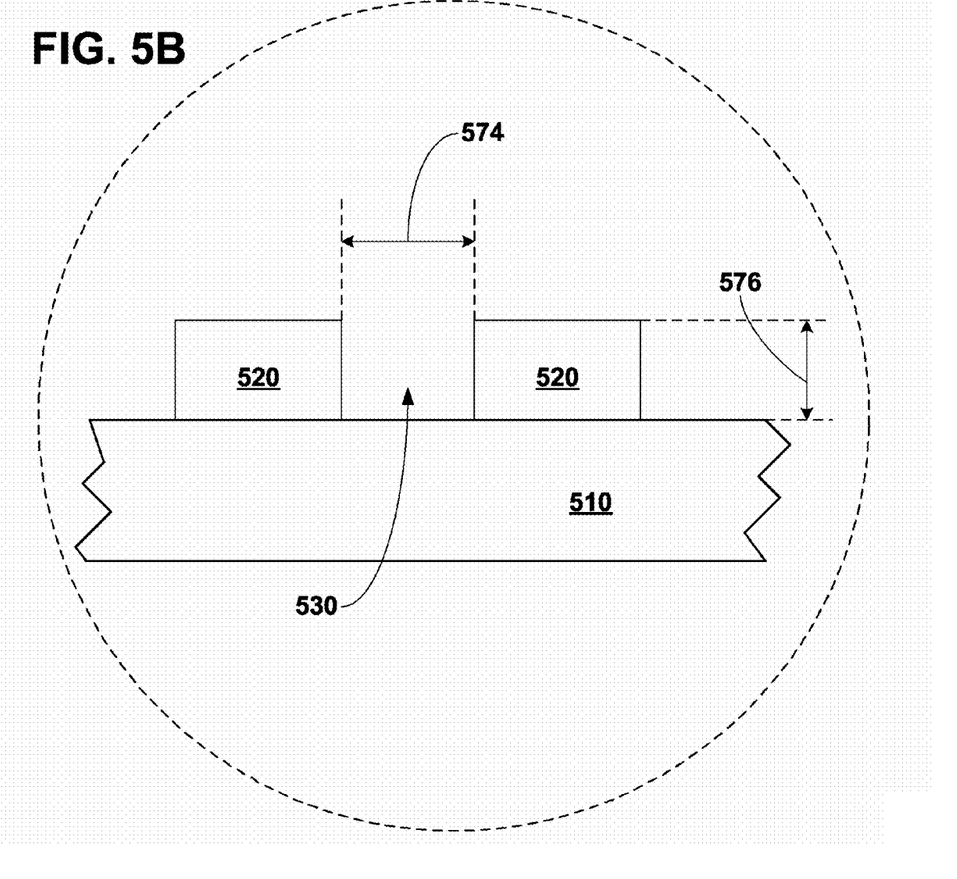
FIG. 5B provides an enlarged view of the embodiment of FIG. 5A.
Figure 5C:
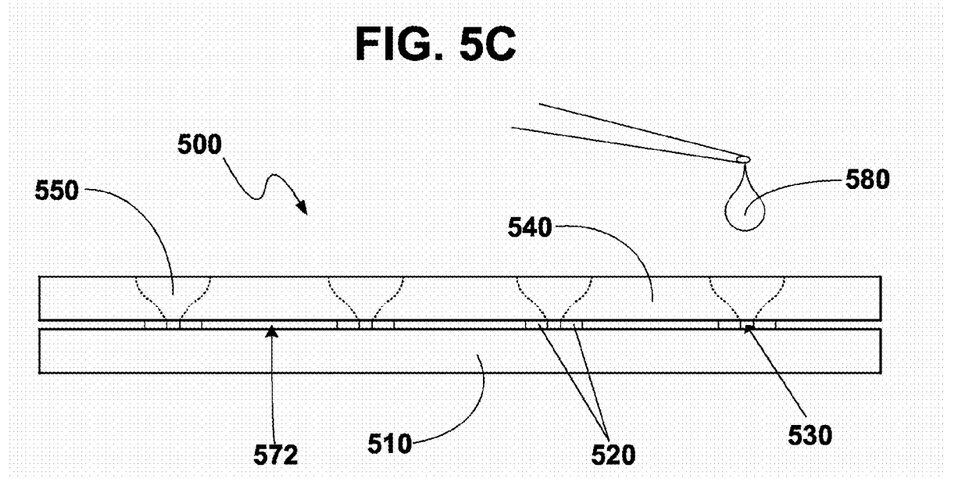

FIGS. 5A and 5C provide a side view of the microfluidic diagnostic device 500 consistent with one embodiment of the present disclosure. This embodiment is similar to the embodiment of FIG. 1, and like components have been assigned like reference numerals. As shown in FIG. 5A, microfluidic device 500 may include a base sheet 510, a printed layer of adhesive 520, the printed adhesive defining at least one fluid transport channel 530, and a cover sheet 540. Cover sheet 540 may include at least one fluid sample inlet portal 550 and may also include at least one vent aperture (not shown). The channel 530 defined by the printed adhesive layer 520 may be separated from other printed channels by an area 572 that is void of adhesive.

FIG. 5B depicts an enlarged view of a portion of the embodiment of FIG. 5A. As shown in FIG. 5B, base sheet 510 may include a printed layer of adhesive 520, the printed adhesive defining at least one fluid transport channel 530. In the preferred embodiment, the adhesive layer 520 may have a thickness 576 ranging from 0.0025 millimeters(mm) to 0.25 mm and the channel 530 may have a mean width 574 of less than, for example, 2.0 mm, 1.5 mm, 1.0 mm, 0.5 mm, 0.25 mm, or 0.1 mm. In some embodiments, the adhesive layer thickness 576 and channel mean width 574 may vary within a single device.

As shown in FIG. 5C, microfluidic device 500 may include a base sheet 510, a printed layer of adhesive 520, the printed adhesive defining at least one fluid transport channel 530, and a cover sheet 540 attached to the base sheet 510 by means of the adhesive layer 520. Cover sheet 540 may include at least one fluid sample inlet portal 550, wherein the portal 550 may be configured to be in fluid communication with at least one fluid transport channel 530 and base sheet 510. The portal 550 may be adapted to allow a fluid sample 580 to flow into the channel 530. At least one channel 530 is defined by the base sheet 510, cover sheet 540 and printed adhesive 520, wherein the channel 530 may pass entirely through the thickness of the adhesive 576 and the adhesive may form the channel sidewalls. The channel 530 defined by the printed adhesive 520 may be separated from other printed channels by an area 572 that is void of adhesive. It may be appreciated that at least one channel 530 has a non-circular cross section.

While a layer of adhesive may define at least one channel, the length of the channel may extend to one or more of the peripheral edges of the adhered base sheet and cover sheet. An inlet portal may also be defined at a peripheral edge of the adhered base sheet and cover sheet. The peripheral edges of the combined base sheet and cover sheet may also define at least one vent aperture, wherein the aperture may be configured to be in fluid communication with at least one channel and may be adapted to aid in fluid sample flow through the channel. A pump and/or vacuum source may be in fluid communication with either the portal, the vent, or both.

It may be appreciated that at least one channel may contain at least one testing reagent composition designed, for example, to detect, upon contact, a specific substance in a sample. In one embodiment, multiple reagent compositions may provide separate testing of a single sample. For example, a single channel may contain different reagents or multiple channels may contain different reagents. In another embodiment, at least one channel may include a reservoir along the fluid flow path of the channel, wherein the reservoir may contain at least one reagent composition. In one embodiment, the reservoirs may include a color-coded, positive or negative, test reagent. It may also be appreciated that the channels and/or reservoirs can be reagent-free. In another embodiment the device may include a chemical, electrical or biological detector which can be placed in fluid communication with a channel.

In other embodiments, the adhesive layer forming the channel sidewalls may contain at least one testing reagent composition, wherein the reagent may detect, upon contact, a specific substance upon contact in a sample.

Either the base sheet, the cover sheet, or both may have hydrophilic surfaces, wherein the surface may be formed of any material exhibiting hydrophilic properties. It may also be appreciated that either the entire base sheet or the entire cover sheet or both may be made of any material exhibiting hydrophilic properties. For example, the material may be formed of a hydrophilic polyester. The material may also be treated, such as by embossing micro ridges or by treating with ozone to affect surface energy and hydrophilicity.

In other embodiments, either the base sheet, the cover sheet, or both may have non-hydrophilic surfaces, wherein the surface may be formed of any material exhibiting non-hydrophilic properties. This may be of particular usefulness when non-aqueous samples are tested or when capillary action is not the primary motive force for moving the liquid through the channel. For example, a sample fluid may flow into at least channel and travel along a fluid flow path of the channel by mechanical means such as vacuum and/or pump, rather than capillary flow action. The vacuum and/or pump may be manually, mechanically, or electrically powered.

It should be noted that the overall shape of the microfluidic diagnostic device may be designed to permit functioning use with any additional and/or applicable testing equipment.

In one embodiment, a microfluidic diagnostic device can be made by utilizing a screen printing technique. A precise layer of liquid (unpolymerized) adhesive is printed onto a hydrophilic surface of a base sheet in a channel pattern, wherein the pattern defines at least one channel passing through the thickness of the adhesive. Liquid adhesive can be forced through a screen, wherein the screen has openings defining a channel pattern. A cover sheet may be adhered to the base sheet with the adhesive, wherein the base sheet, cover sheet, and adhesive together define at least one channel. It may be appreciated that the adhesive can be non-hydrophilic and pressure sensitive. It may also be appreciated that the adhesive may be polymerizable and can be applied in an uncured form that can be crosslinked after printing. The adhesive may be, for example, a prepolymer that can be UV cured, gamma cured or heat cured. In one embodiment, the adhesive may be a UV curable pressure sensitive adhesive, such as MagnaCryl 3500 PSA available from Beacon Chemical Company Inc.

In another embodiment, pad printing may be utilized to apply adhesive. Pad printing can be accomplished using an indirect offset printing process that may involve an adhesive channel pattern being transferred from the printing plate via a silicone pad onto a surface of a base sheet. In other embodiments, spray printing may be utilized to apply adhesive. Spray printing can occur where the adhesive is atomized into fine droplets and deposited onto a surface of a base sheet to form a uniform patterned layer. The adhesive may be either atomized by air pressure or by pumping at extremely high pressures through a small orifice.

In another embodiment, transfer printing may be used to apply the adhesive. Transfer printing may be used to run a pad across a roller or pressed against another pad to pick up a patterned adhesive and then deposit the pattern of adhesive onto a surface of a base sheet. In this process, the adhesive may be cured, or partially cured, prior to transfer onto the surface of the base sheet. In another embodiment, flexographic printing, using a flexible relief plate, may be used to apply the adhesive.

The base sheet and the cover sheet may be sandwiched around the adhesive before or after the adhesive has been polymerized or otherwise solidified. For example, a liquid adhesive pattern may be printed on the base sheet and the cover sheet may be applied to the adhesive prior to curing. After placement of the cover sheet, the adhesive may be cured to secure the base sheet and the cover sheet together. For instance, the adhesive may be radiated with UV light after the cover sheet has been placed. This may allow for the use of a greater range of adhesives.

EXAMPLE

To illustrate the application of the methods described herein, a microfluidic diagnostic device was manufactured using screen printing technology as follows.

To properly align the base sheet, registration holes were cut into a sheet of polyester hydrophilic film (Tesa 62580 lot #62580PV0.009/08). A 150 mesh screen was made to screen print the image shown in FIG. 6 with channels 630 of various widths from 0.254 mm to 0.762 mm. The pattern also provided for space 672 which is void of any adhesive. A UV cure acrylic adhesive, Magna-Cryl 3500 (Beacon Adhesives) was screen printed onto the base sheet and the printed sheet was UV cured at slow speed to cross-link the adhesive. After curing, a 4 mil siliconized release sheet was placed on top of the adhesive to protect it.

Figure 6:
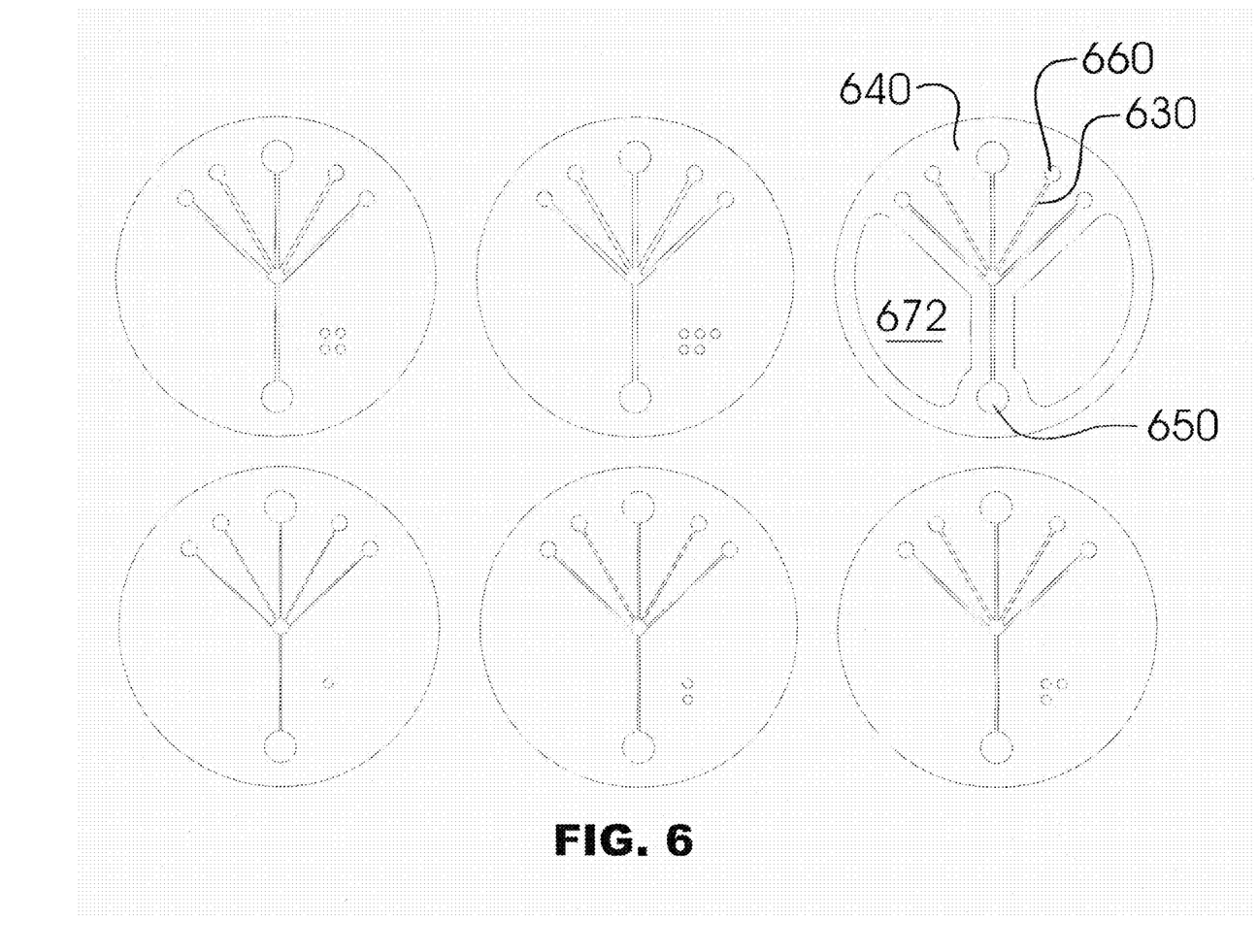
FIG. 6 provides a plan view of one embodiment of diagnostic devices made using a method of printing an adhesive onto a base layer as described herein.

Orifices were cut into a second sheet of the hydrophilic film to produce entry points 650 for fluids and vents 660 for displacing air. The release sheet was then removed from the adhesive and the second sheet (cover sheet) was aligned with the printed adhesive to coordinate the orifices with the different channels. The second sheet was then laminated to the adhesive. The finished sandwich sheet, including a base sheet, adhesive layer with channels, and a top sheet was then cut into individual diagnostic devices such as device 640.

Improved results (fewer bubbles) were obtained when Magna-Cryl 3510 (including a defoamer) was used in place of Magna-Cryl 3500. Devices made from the Magna-Cryl 3510 were tested for capillary fluid flow using water containing food coloring. All devices having channel widths in the range of 0.254 mm to 0.762 mm showed excellent fluid flow through the channel without the aid of a pump or vacuum.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

All references, patents and patent applications and publications that are cited or referred to in this application are incorporated in their entirety herein by reference.

What is claimed is:

1. A method of making a microfluidic diagnostic device, the method comprising:

printing a channel pattern onto a surface of a base sheet with one or more non-adhesive layers prior to printing a layer of adhesive onto the channel pattern, wherein the pattern defines at least one channel passing through the thickness of the adhesive; and adhering a cover sheet to the base sheet with the adhesive to enclose the at least one channel when the cover sheet is adhered to the base sheet and wherein at least a portion of the channel has a mean width less than 1.0 mm, and wherein the cover sheet comprises at least one fluid sample inlet portal and at least one vent aperture each of which is configured to be in fluid communication with the at least one channel.

2. The method set forth in claim 1, wherein the adhesive defines a plurality of channels and wherein adjacent channels are separated by adhesive and by non-channel space that is void of adhesive.

3. The method set forth in claim 1, wherein either the base sheet or the cover sheet or both comprises a hydrophilic surface in contact with the at least one channel.

4. The method set forth in claim 1, wherein at least a portion of the channel has a mean width less than 0.5 mm.

5. The method set forth in claim 1, wherein the adhesive layer has a thickness ranging from 0.0025 mm to 0.25 mm.

6. The method set forth in claim 1, wherein the channel forms a fluid flow path within which a fluid sample to be assayed can pass via capillary action.

7. The method set forth in claim 1, wherein the adhesive is non-hydrophilic.

8. The method set forth in claim 1, wherein the adhesive is pressure sensitive.

9. The method set forth in claim 1, wherein the adhesive is printed to the base sheet by a technique selected from the group consisting of rotary or flat screen printing, pad printing, spray printing, offset printing, flexo graphic printing and transfer printing.

10. A microfluidic diagnostic device adapted for use in the assaying of biological fluids, the device comprising:

a base sheet;

one or more non-adhesive layers disposed on a surface of the base sheet in a channel pattern, and an adhesive layer disposed on the channel pattern wherein the adhesive defines at least one fluid transport channel, the channel having a mean width less than 0.6 mm;

a cover sheet adhered to the base sheet by means of the adhesive, wherein the cover sheet encloses the at least one channel when the cover sheet is adhered to the base sheet; and wherein either the base sheet or the cover sheet or both comprise a hydrophilic surface in contact with the adhesive, and wherein the cover sheet comprises at least one fluid sample inlet portal and at least one vent aperture each of which is configured to be in fluid communication with the at least one channel.

* * * * *